United States Patent
Ali et al.

(10) Patent No.: US 6,405,344 B1
(45) Date of Patent: Jun. 11, 2002

(54) METHOD FOR PERFORMING DESIGN TRADE-OFF

(75) Inventors: Mohamed Ahmed Ali, Niskayuna, NY (US); Vivek Bhatt, Wauwatosa, WI (US); Bijan Dorri, Clifton Park, NY (US); Thomas Gerard Ebben, Sullivan, WI (US); Michael Solomon Idelchik, Mequon, WI (US); Brian Douglas Lounsberry, Thiensville, WI (US); Arlie Russell Martin, Ballston Spa; Michael Charles Ostrowski, Glenville, both of NY (US); Douglas J. Snyder, Brookfield, WI (US)

(73) Assignee: General Electric Company, Schenectady, NY (US)

( * ) Notice: Subject to any disclaimer, the term of this patent is extended or adjusted under 35 U.S.C. 154(b) by 0 days.

(21) Appl. No.: 09/312,688

(22) Filed: May 14, 1999

(51) Int. Cl.[7] ............................................... G06F 17/50

(52) U.S. Cl. ............................................... 716/2; 716/1

(58) Field of Search ......................... 716/1, 2; 700/97; 709/213

(56) References Cited

U.S. PATENT DOCUMENTS

| | | | | |
|---|---|---|---|---|
| 5,914,887 A | * | 6/1999 | Scepanovic et al. | 709/213 |
| RE36,602 E | * | 3/2000 | Sebastian et al. | 700/97 |
| 6,216,252 B1 | * | 4/2001 | Dangelo et al. | 716/1 |

OTHER PUBLICATIONS

Blanchard et al, "Systems Engineering and Analysis" pp. 67–73, 1990.

* cited by examiner

Primary Examiner—Matthew Smith
Assistant Examiner—Paul Dinh
(74) Attorney, Agent, or Firm—Lester R. Hale; Donald S. Ingraham

(57) ABSTRACT

A method for performing design trade-off. A plurality of critical to quality parameters corresponding to features of the design are obtained. A plurality of design specifications, each design specification corresponding to one of the critical to quality parameters, are also obtained. A plurality of designs are obtained where each design includes a plurality of design values and each design value corresponds to one of the critical to quality parameters. The design values are compared to the design specifications for each of the plurality of designs. A total score is generated for each design in response to the comparison.

16 Claims, 3 Drawing Sheets

Fig. 1

| CONCEPTS | IMPORTANCE | UPPER SPECIFICATION LIMIT | TARGET VALUE | LOWER SPECIFICATION LIMIT | DESIGN #1 | DESIGN #2 | DESIGN #3 |
|---|---|---|---|---|---|---|---|
| COST | 1 | 10,000 | | | 8,500 | 9,000 | 5,000 |
| MASS | 1 | 1,000 | | | 800 | 870 | 1,200 |
| SPOT SIZE | 1 | 100 | 75 | 50 | 75 | 55 | 90 |
| TEMPERATURE | 1 | | 40 | | 35 | 42 | 60 |
| 1st CRITICAL SPEED | 1 | 60 | 55 | 50 | 57 | 55 | 51 |
| 2nd CRITICAL SPEED | 1 | | | 85 | 95 | 75 | 82 |
| TOTAL SCORE | | | | | 30 | 22 | 16 |

US 6,405,344 B1

METHOD FOR PERFORMING DESIGN TRADE-OFF

BACKGROUND OF THE INVENTION

The invention relates generally to a method for performing design trade-off and in particular to a method for performing design trade-off in response to critical to quality parameters. Design trade-off is normally performed whenever many options are available for different components of a system. During the design of the system, many alternatives can exist for each component (different brands, different technologies, different manufacturing processes, etc.). The field of systems engineering includes techniques for performing design trade-off, i.e., comparing all possible alternatives in terms of their suitability to the system objectives. In the design for six sigma (DFSS) process, system objectives are represented by critical to quality parameters or CTQ's. The critical to quality parameters reflect aspects of the product needed to meet or exceed customer expectations. There is a perceived need in the art for a method and tool for assisting a user in performing design trade-off in response to critical to quality parameters.

BRIEF SUMMARY OF THE INVENTION

An exemplary embodiment of the invention is directed to a method for performing design trade-off. A plurality of critical to quality parameters corresponding to features of the design are obtained. A plurality of design specifications, each design specification corresponding to one of the critical to quality parameters, are also obtained. A plurality of designs are obtained where each design includes a plurality of design values and each design value corresponds to one of the critical to quality parameters. The design values are compared to the design specifications for each of the plurality of designs. A total score is generated for each design in response to the comparison.

BRIEF DESCRIPTION OF THE DRAWINGS

FIG. 1 is an exemplary design trade-off matrix;

DETAILED DESCRIPTION OF THE INVENTION

Figure 2:
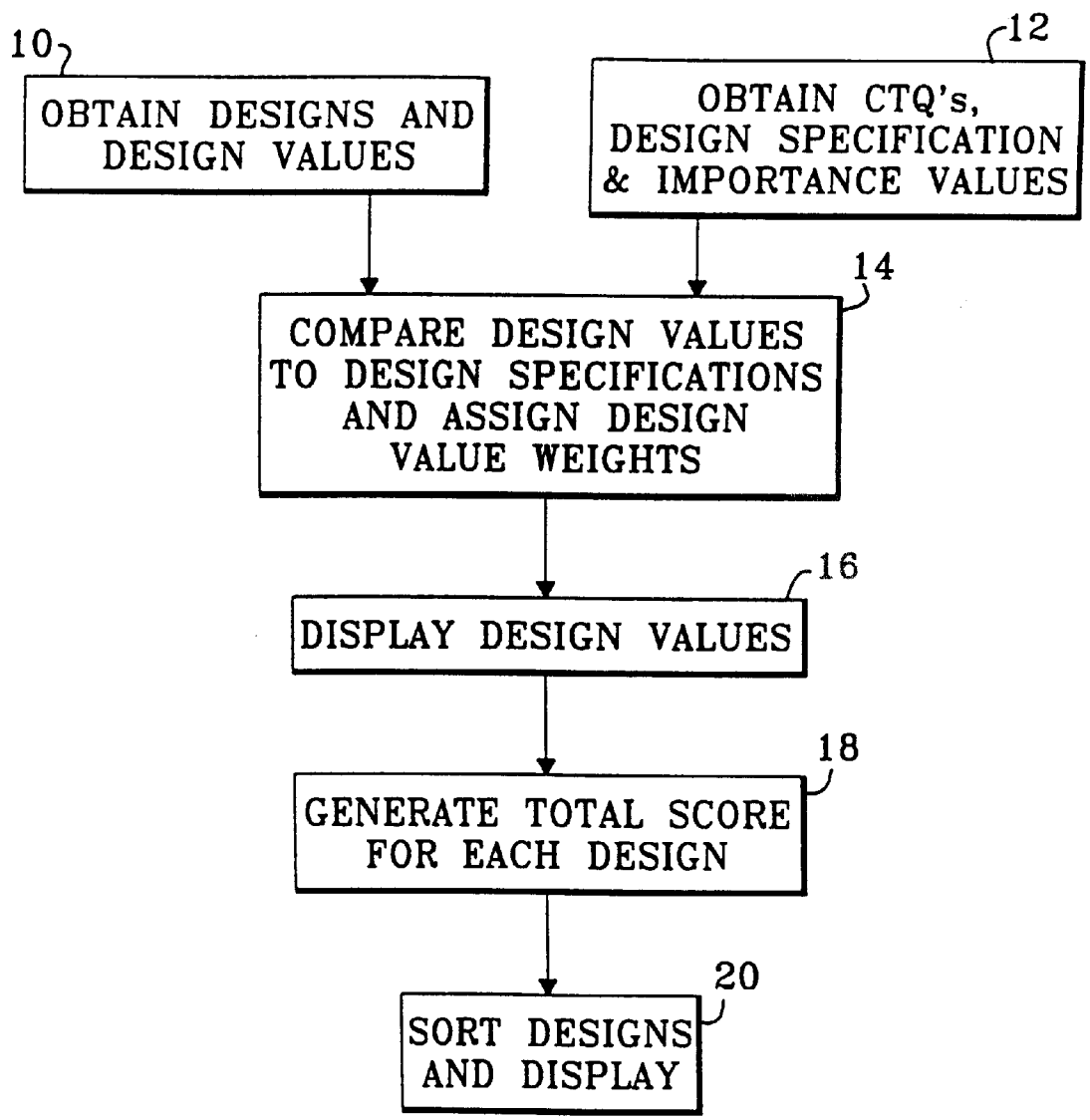
FIG. 2 is a flowchart of a method for performing design trade-off in an exemplary embodiment of the invention.

In the process of performing design trade-off, the user evaluates each design with respect to performance objectives for the system. In addition to performance objectives, a system may need to satisfy regulations, ethical rules, political guidelines, etc. In addition, there are also manufacturability constraints. In many cases, a system which abides by all regulations and meets all of its intended objectives becomes very hard or very expensive to manufacture. Therefore, when comparing alternative designs for a system, all the following can be considered:

1. System overall objectives, particularly in comparison with the competitor's ability to meet those objectives.
2. Regulations and design rules.
3. Manufacturability and cost.

A suggested system design (also called a concept) can be scored according to all of the above categories. Each category may include a set of critical to quality parameters (CTQ's) which may be identified using a Quality Function Deployment process (QFD) or any other process. QFD facilitates identifying the important CTQ's and assigning an importance value to each critical to quality parameter. The importance values resulting from QFD (or any other method) can be utilized directly in ranking different design alternatives as described herein.

FIG. 1 depicts a trade-off matrix 100 in an exemplary embodiment of the invention. The trade-off matrix may be implemented through a general purpose computer and presented to the user through a display. The trade-off matrix 100 includes a plurality of rows representing different designs 102 and a plurality of columns each directed to a critical to quality parameter 104. An importance value 106 is provided for each critical to quality parameter 104 which is used in scoring designs 102 as described herein. The importance value indicates how important the critical to quality parameter is to the design. For example, if the product is a refrigerator, the consumer may consider energy efficiency more important than refrigerator noise and thus energy efficiency would have a higher importance value than refrigerator noise. Associated with each critical to quality parameter 104 are design specifications. The design specifications may include an upper specification limit 110 identifying a maximum value for a critical to quality parameter 104, a lower specification limit 112 identifying a minimum value for a critical to quality parameter 104 and a target value 114 identifying a desired value for a critical to quality parameter 104.

At the intersection of each design 102 and critical to quality parameter 104 is a design value 116. The design value 116 is the value of the corresponding critical to quality parameter 104 in a particular design 102. Each design value 116 is compared to the applicable design specifications 110–114 and displayed in a predetermined manner in response to the result of the comparison. As will be described in detail below with reference to FIG. 3, the design value 116 can be displayed in a plurality of formats. If the design value 116 meets the design specifications 110–114 then the design value is displayed in a first format (e.g., highlighted in green). If the design value 116 does not meet the design specifications 110–114 but deviates from the design specification by less than a predetermined tolerance associated with each critical to quality parameter 104, then the design value 116 is displayed in a second format (e.g., highlighted in yellow). If the design value deviates from the design specifications 110–114 by more than the predetermined tolerance of the critical to quality parameter then the design value 116 is displayed in a third format (e.g., highlighted in red). Graphically displaying how well each design value 116 meets the design specifications 110–114 allows the user to easily determine how well each design 102 meets the critical to quality parameters 104.

A total score or rating 118 is provided for each design 102. The total score 118 is determined based on how well the design 102 meets each critical to quality parameter 104 and the importance 106 of each critical to quality parameter 104. Each design value 116 may be assigned a design value weight based on the amount of deviation between the design value 116 and the design specifications 110–114. For example, a design value weight may be 5 if the design value 116 meets the design specifications 110–114, 1 if the design value 116 is within a predetermined tolerance of the design specifications 110–114, and 0 if the design value 116 deviates from the design specifications 110–114 by more than the predetermined tolerance. The total score 118 is based on the sum of the products of the design value weight and the importance 106. The total score 118 may be normalized by dividing the total score by an optimal score. The optimal score represents a design that meets all the design specifications 110–114 for all critical to quality parameters 104. The designs 102 can then be ranked by total score 118 and displayed to the user as shown in FIG. 1. The design trade-off matrix 100 allows the user to make educated decisions on selecting the most appropriate design 102.

FIG. 2 is a flowchart of a method of generating the trade-off matrix 100 in an exemplary embodiment. The method may be implemented by a general purpose computer programmed to perform the steps shown in FIG. 2. At 10, the designs 102 and design values 116 are obtained. The designs and design values may be retrieved from a database or may be entered by the user. At step 12, the critical to quality parameters 104, importance values 106 and design specifications 110–114 are obtained. The critical to quality parameters 104, importance values 106 and design specifications 110–114 may be retrieved from a database or may be entered by the user. Allowing the user to edit values in the trade-off matrix 100 allows the user to edit entries in the matrix and see the impact on the total score 118 immediately.

At step 14, the design values 116 are compared to the design specifications 110–114 and a design value weight is assigned to each design value 116. As described above, the design value weight indicates a degree of deviation between the design values 116 and the design specifications 110–114. At step 16, each design value 116 is displayed in one of a plurality of formats based on the deviation between the design value 116 and the design specification 110–114. An exemplary method of display includes using different colors to reflect deviation between the design value 116 and the design specifications 110–114. At step 18, a total score 118 for each design 102 is generated. As described above, the total score 118 is based on the sum of the products of the design value weight and the importance 106. At step 20, the designs 102 are sorted based on the total scores 118 and displayed to the user.

Figure 3:
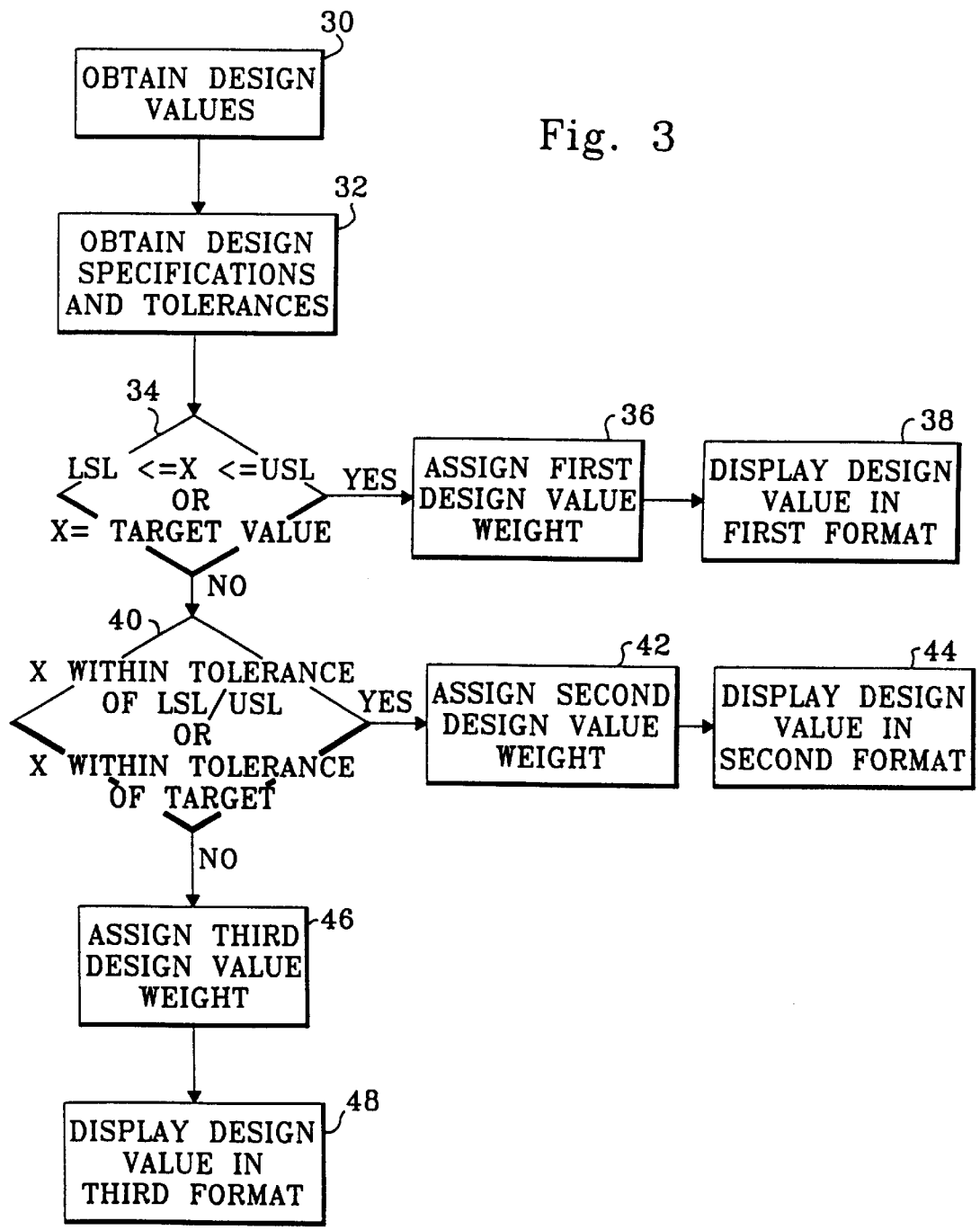
FIG. 3 is a flowchart of a method of comparing design values to design specifications.

FIG. 3 is flowchart of the process of determining the design value weight in an exemplary embodiment. At step 30 the design values 116 for each design 102 are obtained. At step 32, the design specifications 110–114 for each critical to quality parameter 104 are obtained. As described above, the design specifications may include an upper specification limit (USL), a lower specification limit (LSL) and a target value. In addition, the tolerance for each critical to quality parameter is obtained at step 32. The tolerance represents expected deviation in the critical to quality parameter. For example, if the critical to quality parameter is a dimension of a manufactured part, the tolerance reflects the manufacturing tolerance for the part.

The process of comparing the design values 116 to the design specifications will now be described. The critical to quality parameters 104 may include any number of design specifications (e.g., only a USL). Comparisons between the design values 116 and the design specifications are made only for available design specifications. At step 34, it is determined if the design value (represented as X) is within the USL/LSL range or is equal to the target value (if no range is given). If either condition is met, the design value meets the design specifications (i.e., does not deviate from the design specifications) and is assigned a first design value weight at step 36 and displayed in a first format (e.g., green) at step 38. If not, flow proceeds to step 40 where it is determined if the design value is within the predetermined tolerance of the LS/USL range or is within the predetermined tolerance of the target value (if no range is given). If either condition is met, the design value is assigned a second design value weight at step 42 and displayed in a second format (e.g., yellow) at step 44. If neither condition is met at step 40, flow proceeds to step 46 where the design value is assigned a third design value weight and is displayed in a third format (e.g., red) at step 48. As described above, the design value weight is used to determine the total score 118 for each design 102.

There is often a variable level confidence associated with the design values 116 in the design trade-off matrix 100. For example, a user may be 95% sure that the design value 116 is accurate. To incorporate the varying level of confidence, a confidence value may be associated with one or more design values 116. A confidence value may range from 0 to 100% with 0% indicating no confidence and 100% for complete confidence in the number. The confidence value can be utilized to generate design value ranges having a minimum design value and a maximum design value as opposed to a single design value. For example, if a design value is 100 with a 95% confidence value, then the design value range is 95 to 105 (100+−5%). The design value range can be computed from the confidence value or entered by the user. The determination of the total score shown in step 18 of FIG. 2 will be determined twice; once using the minimum design values and once using the maximum design values. This results in first and second total scores defining a total score range. The total scores can then be ranked based on the total score ranges.

The present invention can be embodied in the form of computer-implemented processes and apparatuses for practicing those processes. The present invention can also be embodied in the form of computer program code containing instructions embodied in tangible media, such as floppy diskettes, CD-ROMs, hard drives, or any other computer-readable storage medium, wherein, when the computer program code is loaded into and executed by a computer, the computer becomes an apparatus for practicing the invention. The present invention can also be embodied in the form of computer program code, for example, whether stored in a storage medium, loaded into and/or executed by a computer, or transmitted over some transmission medium, such as over electrical wiring or cabling, through fiber optics, or via electromagnetic radiation, wherein, when the computer program code is loaded into and executed by a computer, the computer becomes an apparatus for practicing the invention. When implemented on a general-purpose microprocessor, the computer program code segments configure the microprocessor to create specific logic circuits.

While the invention has been described with reference to an exemplary embodiment, it will be understood by those skilled in the art that various changes may be made and equivalents may be substituted for elements thereof without departing from the scope of the invention. In addition, many modifications may be made to adapt a particular situation or material to the teachings of the invention without departing from the essential scope thereof. Therefore, it is intended that the invention not be limited to the exemplary embodiment disclosed, but that the invention will include all embodiments falling within the scope of the appended claims.

What is claimed is:

1. A method for performing design trade-off comprising:
   obtaining a plurality of critical to quality parameters;
   obtaining a plurality of design specifications, each design specification corresponding to one of said critical to quality parameters;
   obtaining a plurality of designs, each design including a plurality of design values, each design value corresponding to one of said critical to quality parameters;

comparing said design values to said design specifications for each of said plurality of designs;

generating a total score for each design in response to said comparing;

obtaining a tolerance value for at least one critical to quality parameter;

wherein said comparing includes determining if said design value deviates from said design specification by less than said tolerance;

displaying said design value in a first format if said design value meets said design specifications; and displaying said design value in a second format if said design value deviates from said design specification by less than said tolerance.

2. The method of claim 1 wherein:

said design specifications includes an upper specification limit defining a maximum value for at least one critical to quality parameter.

3. The method of claim 1 wherein:

said design specifications includes a lower specification limit defining a minimum value for at least one critical to quality parameter.

4. The method of claim 1 wherein:

said design specifications includes a target value defining a desired value for at least one critical to quality parameter.

5. The method of claim 1 further comprising:

displaying said design values in one of a plurality of formats in response to said comparing.

6. The method of claim 1 further comprising:

displaying said design value in a third format if said design value deviates from said design specification by more than said tolerance.

7. The method of claim 1 further comprising:

obtaining an importance value for each of said critical to quality parameters; and assigning each design value a design value weight indicating deviation of said design value from said design specifications;

wherein said generating a total score includes determining a product of said design value weight and said importance for each design value and summing said products.

8. The method of claim 1 further comprising:

obtaining a confidence value for at least one of said design values; and determining a design value range having a minimum design value and a maximum design value in response to said confidence value; wherein said generating a total score includes generating a first total score in response to said minimum design value and generating a second total score in response to said maximum design value.

9. A storage medium encoded with machine-readable computer program code for performing design trade-off, the storage medium including instructions for causing a computer to implement a method comprising:

obtaining a plurality of critical to quality parameters;

obtaining a plurality of design specifications, each design specification corresponding to one of said critical to quality parameters;

obtaining a plurality of designs, each design including a plurality of design values, each design value corresponding to one of said critical to quality parameters;

comparing said design values to said design specifications for each of said plurality of designs;

generating a total score for each design in response to said comparing;

obtaining a tolerance value for at least one critical to quality parameter;

wherein said comparing includes determining if said design value deviates from said design specification by less than said tolerance;

displaying said design value in a first format if said design value meets said design specifications; and displaying said design value in a second format if said design value deviates from said design specification by less than said tolerance.

10. The storage medium of claim 9 wherein:

said design specifications includes an upper specification limit defining a maximum value for at least one critical to quality parameter.

11. The storage medium of claim 9 wherein:

said design specifications includes a lower specification limit defining a minimum value for at least one critical to quality parameter.

12. The storage medium of claim 9 wherein:

said design specifications includes a target value defining a desired value for at least one critical to quality parameter.

13. The storage medium of claim 9 further comprising instructions for causing the computer to implement:

displaying said design values in one of a plurality of formats in response to said comparing.

14. The storage medium of claim 9 further comprising instructions for causing the computer to implement:

displaying said design value in a third format if said design value deviates from said design specification by more than said tolerance.

15. The storage medium of claim 9 further comprising instructions for causing the computer to implement:

obtaining an importance value for each of said critical to quality parameters; and assigning each design value a design value weight indicating deviation of said design value from said design specifications;

wherein said generating a total score includes determining a product of said design value weight and said importance for each design value and summing said products.

16. The storage medium of claim 9 further comprising instructions for causing the computer to implement:

obtaining a confidence value for at least one of said design values; and determining a design value range having a minimum design value and a maximum design value in response to said confidence value;

wherein said generating a total score includes generating a first total score in response to said minimum design value and generating a second total score in response to said maximum design value.

* * * * *